(12) United States Patent
Ichihashi et al.

(10) Patent No.: US 10,026,853 B2
(45) Date of Patent: Jul. 17, 2018

(54) SOLAR CELL

(71) Applicant: Panasonic Intellectual Property Management Co., Ltd., Osaka (JP)

(72) Inventors: Yoshinari Ichihashi, Osaka (JP); Motohide Kai, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 29 days.

(21) Appl. No.: 14/724,992

(22) Filed: May 29, 2015

(65) Prior Publication Data

US 2015/0349146 A1   Dec. 3, 2015

(30) Foreign Application Priority Data

May 30, 2014 (JP) .................................. 2014-112437
Sep. 16, 2014 (JP) .................................. 2014-187380

(51) Int. Cl.
| | |
|---|---|
| *H01L 31/0224* | (2006.01) |
| *H01L 31/0216* | (2014.01) |
| *H01L 31/075* | (2012.01) |
| *H01L 31/0747* | (2012.01) |

(52) U.S. Cl.
CPC .......... *H01L 31/02167* (2013.01); *H01L 31/022441* (2013.01); *H01L 31/075* (2013.01); *H01L 31/0747* (2013.01); *Y02E 10/50* (2013.01)

(58) Field of Classification Search
None
See application file for complete search history.

(56) References Cited

U.S. PATENT DOCUMENTS

| | | | |
|---|---|---|---|
| 2002/0003255 A1* | 1/2002 | Usuki | H01L 21/28273 257/316 |
| 2007/0238316 A1* | 10/2007 | Ohashi | H01L 21/28202 438/775 |
| 2008/0295885 A1* | 12/2008 | Lee | C30B 13/24 136/256 |

(Continued)

FOREIGN PATENT DOCUMENTS

| | | | |
|---|---|---|---|
| JP | 2012-033666 A | 2/2012 | |
| JP | WO 2012132961 A1 * | 10/2012 | ..... H01L 31/022441 |
| WO | 2012-132655 A1 | 10/2012 | |

*Primary Examiner* — Magali P Slawski
(74) *Attorney, Agent, or Firm* — Metrolexis Law Group, PLLC

(57) ABSTRACT

A semiconductor substrate of any one of a first conductivity type and a second conductivity type includes a first main surface and a second main surface. A first semiconductor layer of the first conductivity type is provided on the first main surface. A second semiconductor layer of the second conductivity type is provided on the first main surface. A first electrode is electrically connected to the first semiconductor layer. A second electrode is electrically connected to the second semiconductor layer. An insulating layer comprises silicon nitride and is arranged between the first semiconductor layer and the second semiconductor layer in an overlap region where the second semiconductor layer is provided above the first semiconductor layer. An anti-diffusion film is arranged between the insulating layer and the first semiconductor layer and is configured to prevent nitrogen from diffusing from the insulating layer into the first semiconductor layer.

17 Claims, 7 Drawing Sheets

(56) References Cited

U.S. PATENT DOCUMENTS

| | | | |
|---|---|---|---|
| 2009/0294828 A1* | 12/2009 | Ozawa | H01L 27/11568 257/319 |
| 2010/0164048 A1* | 7/2010 | Figuet | H01L 27/14689 257/458 |
| 2013/0180585 A1* | 7/2013 | Goto | H01L 31/022441 136/256 |
| 2014/0024167 A1* | 1/2014 | Kirihata | H01L 31/022441 438/87 |

* cited by examiner

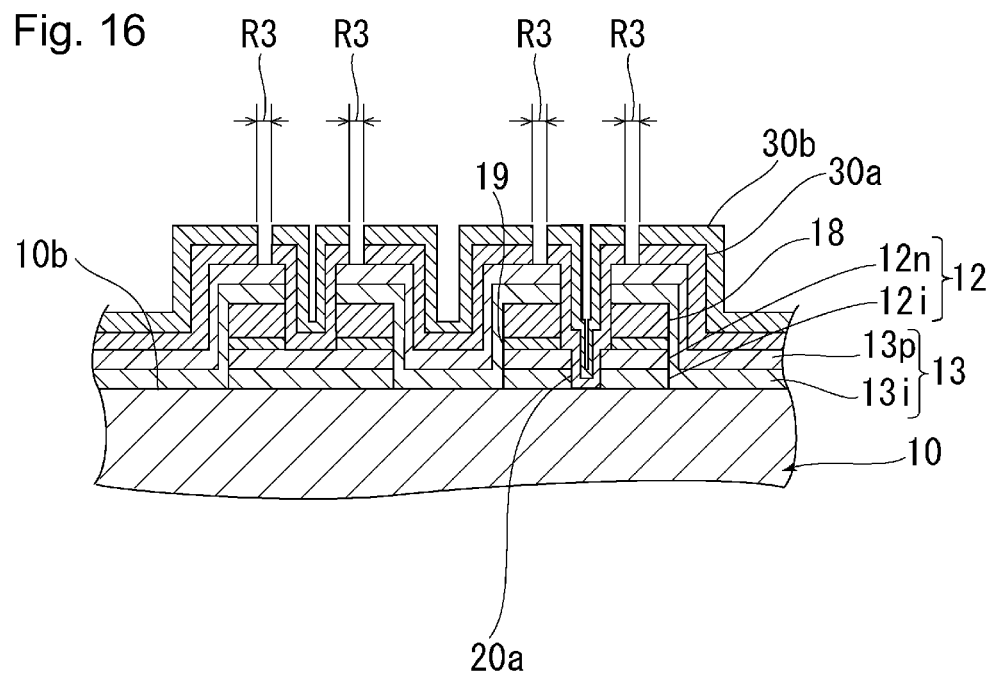

SOLAR CELL

CROSS REFERENCE TO RELATED APPLICATIONS

This application claims priority based on 35 USC 119 from prior Japanese Patent Applications No. 2014-112437 filed on May 30, 2014, entitled, and No. 2014-187380 filed on Sep. 16, 2014, entitled "SOLAR CELL" the entire contents of which are hereby incorporated by reference.

BACKGROUND

This disclosure relates to a solar cell.

A solar cell in which a p-type region and an n-type region are formed in the back surface thereof, i.e., so-called a back contact solar cell has been proposed as a solar cell with high power generation efficiency (Japanese Patent Application Publication No. 2012-33666, for example). Such a back contact solar cell generally includes a region where a p-type semiconductor layer and an n-type semiconductor layer overlap each other with an insulating layer interposed therebetween.

Use of silicon nitride or the like as an insulating layer entails a problem in that nitrogen diffuses from the insulating layer into an underlying semiconductor layer in the process of manufacturing a solar cell, which gives adverse effects on the characteristics of the semiconductor layer, e.g., increase in its resistance and degradation in its passivation properties.

SUMMARY

A solar cell according to one aspect of the embodiment includes: a semiconductor substrate of any one of a first conductivity type and a second conductivity type including a first main surface and a second main surface, a first semiconductor layer of the first conductivity type provided on the first main surface, a second semiconductor layer of the second conductivity type provided on the first main surface; a first electrode electrically connected to the first semiconductor layer, a second electrode electrically connected to the second semiconductor layer, an insulating layer comprising silicon nitride and arranged between the first semiconductor layer and the second semiconductor layer in an overlap region where the second semiconductor layer is provided above the first semiconductor layer, and an anti-diffusion film arranged between the insulating layer and the first semiconductor layer and configured to prevent nitrogen from diffusing from the insulating layer into the first semiconductor layer.

BRIEF DESCRIPTION OF THE DRAWINGS

FIG. 16 is a schematic sectional view for explaining a process of manufacturing the solar cell in the embodiment.

DETAILED DESCRIPTION

Figure 1:
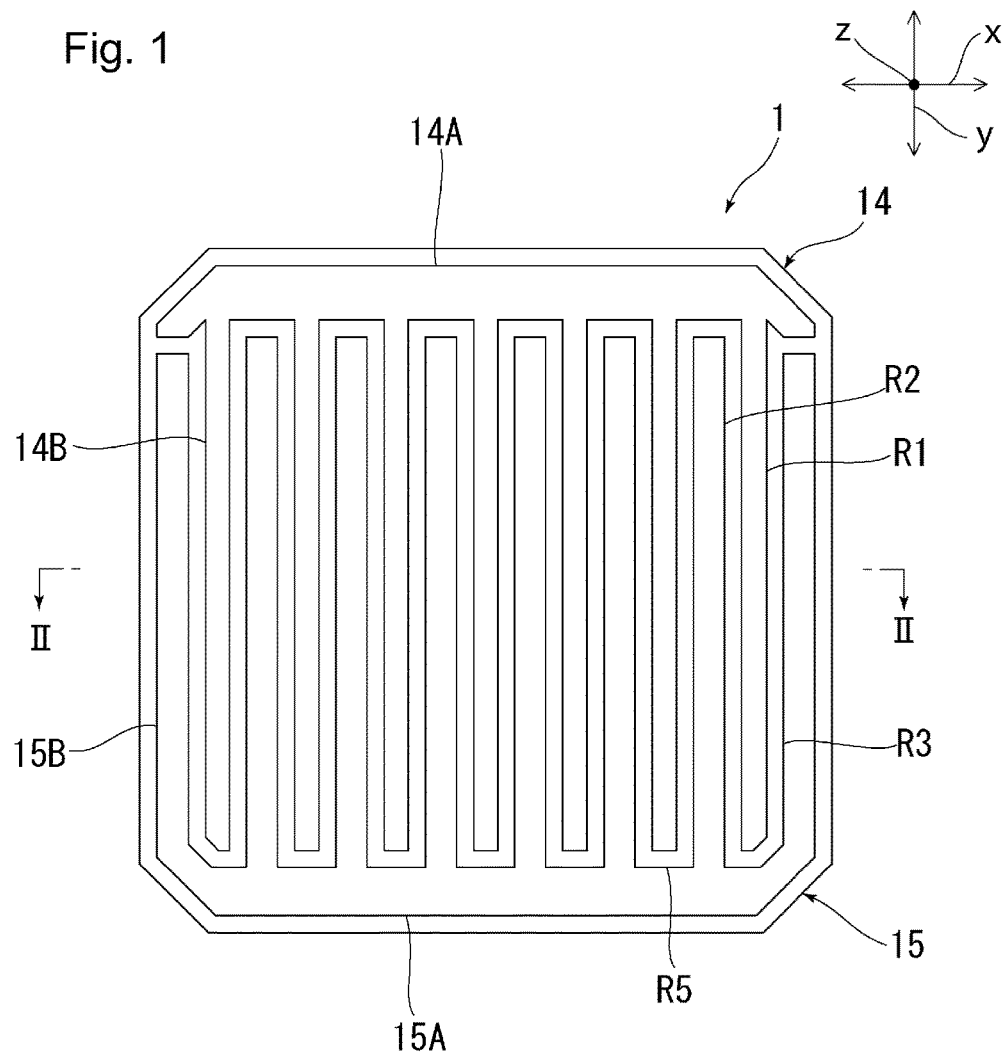
FIG. 1 is a schematic plan view of a solar cell in an embodiment.

Hereinbelow, a preferred embodiment is described. Note that, the following embodiment is merely illustrative and the invention is not limited to the following embodiment. Further, members in the drawings having substantially the same function are sometimes referred to by the same reference numeral.

Prepositions, such as "on", "over" and "above" may be defined with respect to a surface, for example a layer surface, regardless of that surface's orientation in space. The preposition "above" may be used in the specification and claims even if a layer is in contact with another layer. The preposition "on" may be used in the specification and claims when a layer is not in contact with another layer, for example, when there is an intervening layer between them.

Figure 2:
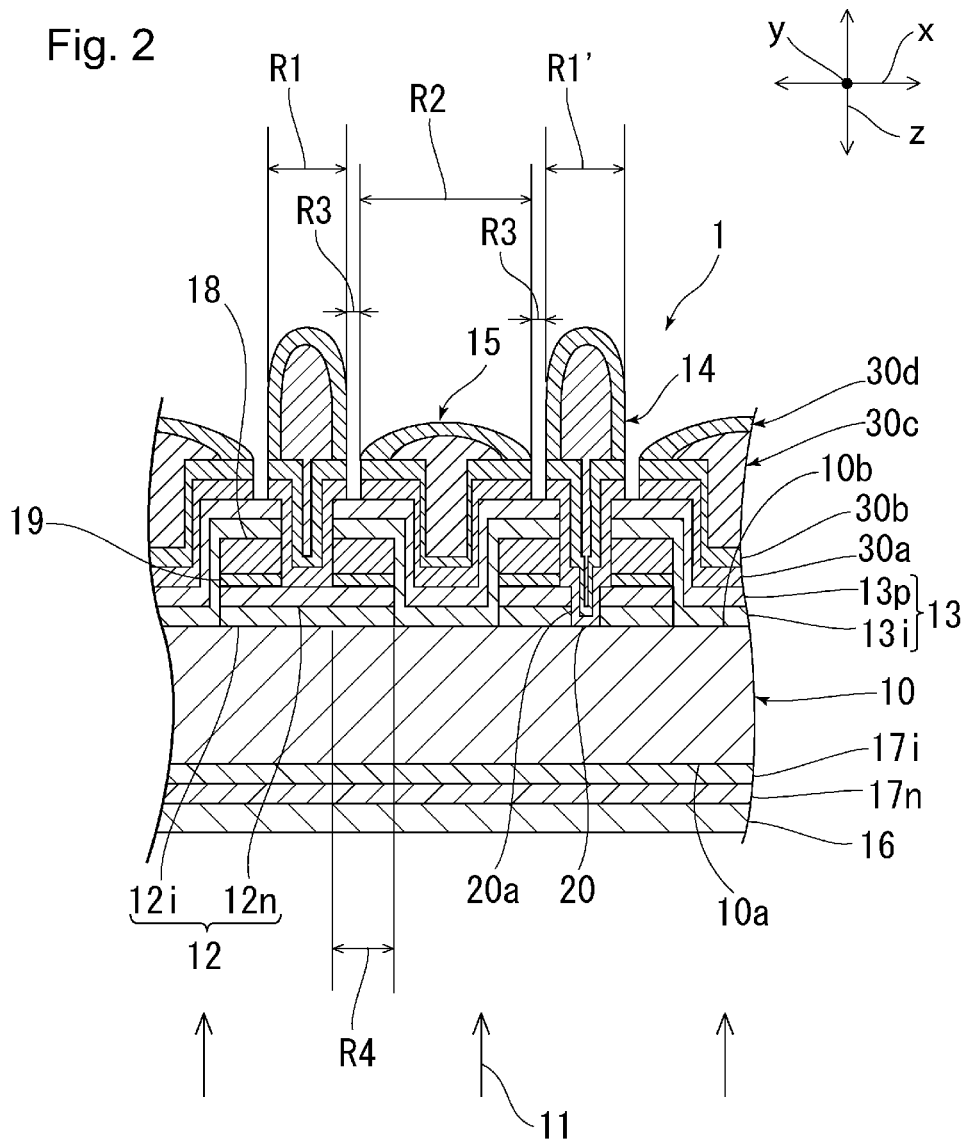
FIG. 2 is a schematic sectional view illustrating in an enlarged scale a part of a section of FIG. 1 taken along the line II-II.

FIG. 1 is a schematic plan view of a solar cell in the embodiment. FIG. 2 is a schematic sectional view illustrating in an enlarged scale a part of a section of FIG. 1 taken along the line II-II.

As illustrated in FIG. 2, solar cell 1 includes semiconductor substrate 10. Semiconductor substrate 10 includes light receiving surface 10a as a second main surface and back surface 10b as a first main surface. Semiconductor substrate 10 is configured to generate carriers in light receiving surface 10a by receiving light 11. Here, carriers indicate holes and electrons generated upon absorption of light by semiconductor substrate 10.

Semiconductor substrate 10 is formed of a crystalline semiconductor substrate having an n-type or p-type conductivity. Specific examples of such a crystalline semiconductor substrate include crystalline silicon substrates such as a monocrystalline silicon substrate and a polycrystalline silicon substrate. Note that semiconductor substrate 10 may be formed of a semiconductor substrate other than such a crystalline semiconductor substrate. For example, a compound semiconductor substrate formed of GaAs, InP, and the like may be used instead of semiconductor substrate 10. In the embodiment described below, description is given of an example where semiconductor substrate 10 is formed of an n-type (first-conductivity-type) crystalline silicon substrate.

A semiconductor film formed of an intrinsic amorphous semiconductor (hereinafter, an intrinsic semiconductor is called an "i-type semiconductor"), i.e., i-type amorphous semiconductor film 17i is formed on light receiving surface 10a of semiconductor substrate 10. In this embodiment, i-type amorphous semiconductor film 17i is specifically formed of i-type amorphous silicon. The thickness of i-type amorphous semiconductor film 17i is not particularly limited as long as it does not substantially affect power generation. The thickness of i-type amorphous semiconductor film 17i may be in the range of about several nm to 25 nm, for example.

Note that, in the embodiment, an "amorphous semiconductor" includes a microcrystalline semiconductor. A microcrystalline semiconductor indicates a semiconductor in which semiconductor crystals are deposited in an amorphous semiconductor.

N-type amorphous semiconductor film 17n having the same conductivity type as semiconductor substrate 10 is formed on i-type amorphous semiconductor film 17i. N-type amorphous semiconductor film 17n is an amorphous semiconductor film having an n-type conductivity doped with an n-type dopant such as phosphor (P). Specifically, n-type amorphous semiconductor film 17n is formed of n-type amorphous silicon in this embodiment. The thickness of n-type amorphous semiconductor film 17n is not particularly limited. The thickness of n-type amorphous semiconductor film 17n may be in the range of about 2 nm to 50 nm, for example.

Insulating layer 16 which functions both as an antireflection film and as a protection film is formed on n-type amorphous semiconductor film 17n. Insulating layer 16 may be formed of silicon oxide, silicon nitride, or silicon oxynitride, for example. The thickness of insulating layer 16 may be set appropriately according to the antireflection properties and the like of an antireflection film intended to be applied to this layer. The thickness of insulating layer 16 may be in the range of about 80 nm to 100 nm, for example.

A layered structure including i-type amorphous semiconductor film 17i, n-type amorphous semiconductor film 17n, and insulating layer 16 described above functions as a passivation layer and an antireflection film of semiconductor substrate 10.

N-type (first-conductivity-type) first semiconductor layer 12 and p-type (second-conductivity-type) second semiconductor layer 13 are formed on back surface 10b of semiconductor substrate 10. N-type region R1 being a first-conductivity-type region has first semiconductor layer 12 whereas p-type region R2 being a second-conductivity-type region has second semiconductor layer 13. Out of n-type region R1 and p-type region R2, a region where fingers 14B and 15B to be described later are provided is formed to extend in y directions. As illustrated in FIG. 1, each of n-type region R1 and p-type region R2 is pectinate in shape. N-type region R1 and p-type region R2 are formed to interdigitate each other, and thus they are arranged alternately in x directions perpendicular to the y directions. Insulating region R3 is formed between n-type region R1 and p-type region R2. As illustrated in FIG. 1, insulating region R3 is formed such that it extends in a Y direction and then turns in turn region R5 to extend in the opposite Y direction.

As illustrated in FIG. 2, first semiconductor layer 12 has a layered structure including i-type amorphous semiconductor film 12i as a first intrinsic semiconductor film and n-type amorphous semiconductor film 12n as a first semiconductor film. I-type amorphous semiconductor film 12i is formed on back surface 10b of semiconductor substrate 10. N-type amorphous semiconductor film 12n is formed on i-type amorphous semiconductor film 12i. I-type amorphous semiconductor film 12i is formed of i-type amorphous silicon similarly to i-type amorphous semiconductor film 17i. The thickness of i-type amorphous semiconductor film 12i is not particularly limited as long as it does not substantially affect power generation. The thickness of i-type amorphous semiconductor film 12i may be in the range of about several nm to 25 nm, for example.

N-type amorphous semiconductor film 12n is doped with an n-type dopant such as phosphor (P) similarly to n-type amorphous semiconductor film 17n, and has an n-type conductivity similarly to semiconductor substrate 10. In this embodiment, n-type amorphous semiconductor film 12n is formed of n-type amorphous silicon. The thickness of n-type amorphous semiconductor film 12n is not particularly limited. The thickness of n-type amorphous semiconductor film 12n may be in the range of about 2 nm to 50 nm, for example.

Second semiconductor layer 13 has a layered structure including i-type amorphous semiconductor film 13i as a second intrinsic semiconductor film and p-type amorphous semiconductor film 13p as a second semiconductor film. I-type amorphous semiconductor film 13i is formed on back surface 10b of semiconductor substrate 10. P-type amorphous semiconductor film 13p is formed on i-type amorphous semiconductor film 13i.

I-type amorphous semiconductor film 13i is formed of i-type amorphous silicon. The thickness of i-type amorphous semiconductor film 13i is not particularly limited. The thickness of i-type amorphous semiconductor film 13i may be in the range of about several nm to 25 nm, for example.

P-type amorphous semiconductor film 13p is an amorphous semiconductor film doped with a p-type dopant such as boron (B) and has a p-type conductivity. In this embodiment, p-type amorphous semiconductor film 13p is formed of p-type amorphous silicon. The thickness of p-type amorphous semiconductor film 13p is not particularly limited. The thickness of p-type amorphous semiconductor film 13p may be in the range of about 2 nm to 50 nm, for example.

As illustrated in FIG. 2, second semiconductor layer 13 is laid over first semiconductor layer 12 in overlap region R4. In overlap region R4, insulating layer 18 is arranged between first semiconductor layer 12 and second semiconductor layer 13. In addition, anti-diffusion film 19 is arranged between insulating layer 18 and first semiconductor layer 12.

Insulating layer 18 is formed of a film containing silicon nitride such as a silicon nitride film or a silicon oxynitride film. In this embodiment, insulating layer 18 is formed of a silicon nitride film. The thickness of insulating layer 18 is preferably in the range of 30 nm to 100 nm, and more preferably in the range of 40 nm to 70 nm.

Anti-diffusion film 19 is provided to prevent nitrogen from diffusing from insulating layer 18 into first semiconductor layer 12. Anti-diffusion film 19 may be formed of a Si-rich silicon nitride film or a silicon oxide film. The thickness of anti-diffusion film 19 is preferably in the range of 1 nm to 5 nm, and more preferably in the range of 1 nm to 2 nm.

Here, the Si-rich silicon nitride film indicates a silicon nitride film, which contains a larger amount of Si than the stoichiometric composition of $Si_3N_4$. If insulating layer 18 contains silicon nitride, the concentration of Si in the Si-rich silicon nitride film is set higher than the concentration of Si in insulating layer 18. If the Si-rich silicon nitride film is formed as anti-diffusion film 19, anti-diffusion film 19 and insulating layer 18 may be successively formed in the same chamber, so that anti-diffusion film 19 and insulating layer 18 can be formed simply. The Si-rich silicon nitride film may have a Si concentration gradient in the film thickness direction.

In this embodiment, i-type amorphous semiconductor film 13i having such a thickness as not to substantially affect power generation is arranged between crystalline semiconductor substrate 10 and p-type amorphous semiconductor film 13p. By providing i-type amorphous semiconductor film 13i between n-type semiconductor substrate 10 and p-type amorphous semiconductor film 13p as in this embodiment, it is possible to suppress recombination of minority carriers at the junction interface between semiconductor substrate 10 and p-type second semiconductor layer 13, and thereby improve photoelectric conversion efficiency.

Note that each of i-type amorphous semiconductor films 12i, 13i, and 17i, n-type amorphous semiconductor films 12n and 17n, and p-type amorphous semiconductor film 13p preferably contains hydrogen to enhance its passivation properties.

N-side electrode 14 as a first electrode is formed on n-type amorphous semiconductor film 12n. N-side electrode 14 is configured to collect electrons. Meanwhile, p-side electrode 15 as a second electrode is formed on p-type amorphous semiconductor film 13p. P-side electrode 15 is configured to collect holes. P-side electrode 15 and n-side electrode 14 are electrically insulated from each other by insulating region R3 interposed therebetween.

As described above, each of n-type region R1 and p-type region R2 is pectinate in shape in this embodiment. Accordingly, as illustrated in FIG. 1, n-side electrode 14 (p-side electrode 15) includes busbar 14A (15A) and fingers 14B (15B). Here, n-side electrode 14 (p-side electrode 15) may have a busbarless structure including only fingers 14B (15B) and not including busbar 14A (15A).

The structure of each of n-side electrode 14 and p-side electrode 15 is not particularly limited as long as they are capable of collecting carriers. As illustrated in FIG. 2, in this embodiment, each of n-side electrode 14 and p-side electrode 15 is a stacked body including first to fourth conductive layers 30a to 30d.

First conductive layer 30a may be formed of, for example, transparent conductive oxide (TCO) such as indium tin oxide (ITO). Specifically, in this embodiment, first conductive layer 30a is formed of ITO. The thickness of first conductive layer 30a may be in the range of about 50 nm to 100 nm, for example. Note that first conductive layer 30a may be formed by a thin-film formation method such as a sputtering method or a chemical vapor deposition (CVD) method.

Each of second to fourth conductive layers 30b to 30d may be formed of metal such as Cu or an alloy thereof, for example. Specifically, in this embodiment, each of second and third conductive layers 30b and 30c is formed of Cu, and fourth conductive layer 30d is formed of Sn. The thicknesses of second to fourth conductive layers 30b to 30d may be in the range of about 50 nm to 1000 nm, about 10 μm to 20 μm, and about 1 μm to 5 μm respectively, for example.

In this embodiment, second conductive layer 30b out of first to fourth conductive layers 30a to 30d constitutes a seed layer. Here, a "seed layer" indicates a layer serving as a starting point for plating growth. A seed layer is generally formed of metal or an alloy thereof. Second conductive layer 30b as a seed layer may be formed by, for example, a thin-film formation method other than a plating method, such as a sputtering method, a deposition method, a printing method, or an inkjet method.

In this embodiment, each of third and fourth conductive layers 30c and 30d is formed of a plated film.

As illustrated in FIG. 2, leak path 20 is formed in n-type region R1'. Leak path 20 is formed by forming through-hole 20a in first semiconductor layer 12 and forming n-side electrode 14 as the first electrode being in contact with first main surface 10b through through-hole 20a. Leak path 20 enables a current, generated upon application of a reversely-biased voltage to solar cell 1, to leak therethrough, which can reduce the hot spot phenomenon in solar cell 1. To this end, at least one leak path 20 may be enough in solar cell 1.

Although leak path 20 is formed in n-side region R1' which is a specific region of n-side region R1 in this embodiment, the invention is not limited thereto. A leak path may be formed in a through-hole formed in second semiconductor layer 13 of p-side region R2. Alternatively, leak paths may be formed in n-side region R1 and p-side region R2, respectively.

Although leak path 20 is formed in solar cell 1 in this embodiment as described above, leak path 20 does not necessarily have to be formed in the solar cell of the embodiment.

In this embodiment, anti-diffusion film 19 is arranged between insulating layer 18 and first semiconductor layer 12. Anti-diffusion film 19 can prevent nitrogen contained in insulating layer 18 from diffusing from insulating layer 18 into first semiconductor layer 12 in a process of manufacturing solar cell 1. Because first semiconductor layer 12 is as thin as about 10 nm, nitrogen contained in insulating layer 18 can diffuse not only to the vicinity of the junction between first semiconductor layer 12 and insulating layer 18 but also to the vicinity of the junction between first semiconductor layer 12 and semiconductor substrate 10, which might degrade the passivation function of first semiconductor layer 12 on the surface of semiconductor substrate 10 and increase the resistance of first semiconductor layer 12. Anti-diffusion film 19 can prevent the performance of first semiconductor layer 12 such as passivation properties from being degraded due to the diffusion of nitrogen.

In this embodiment, the first-conductivity-type semiconductor layer (first semiconductor layer 12) including the first intrinsic semiconductor film (i-type amorphous semiconductor film 12i) provided on first main surface 10b and the first-conductivity-type first semiconductor film (n-type amorphous semiconductor film 12n) provided on the first intrinsic semiconductor film (i-type amorphous semiconductor film 12i) is taken as an example of a first-conductivity-type semiconductor layer, and the second-conductivity-type semiconductor layer (second semiconductor layer 13) including the second intrinsic semiconductor film (i-type amorphous semiconductor film 13i) provided on first main surface 10b and the second-conductivity-type second semiconductor film (p-type amorphous semiconductor film 13p) provided on the second intrinsic semiconductor film (i-type amorphous semiconductor film 13i) is taken as an example of a second-conductivity-type semiconductor layer.

However, the "first-conductivity-type semiconductor layer" and "second-conductivity-type semiconductor layer" of the invention are not limited thereto. For example, the first-conductivity-type semiconductor layer may include only the first-conductivity-type first semiconductor film, and the second-conductivity-type semiconductor layer may include only the second-conductivity-type second semiconductor film. Thus, the first intrinsic semiconductor film and the second intrinsic semiconductor film do not necessarily have to be provided in the first-conductivity-type semiconductor layer and the second-conductivity-type semiconductor layer. Besides, each of the first intrinsic semiconductor film and the second intrinsic semiconductor film does not have to be an i-type amorphous semiconductor film and may be formed of an oxide semiconductor film such as a silicon oxide film or a nitride semiconductor film such as a silicon nitride film, for example. When any of the oxide semiconductor film and the nitride semiconductor film is used, the film preferably has such a thickness as to allow a tunneling current to pass therethrough.

<Method of Manufacturing Solar Cell>

Hereinbelow, a method of manufacturing solar cell 1 of this embodiment is described with reference to FIGS. 3 to 16. Note that processes of forming i-type amorphous semiconductor film 17i, n-type amorphous semiconductor film 17n, and insulating layer 16 on light receiving surface 10a are not described in the following description on the method of manufacturing solar cell 1 with reference to FIGS. 3 to 16.

Figure 3:
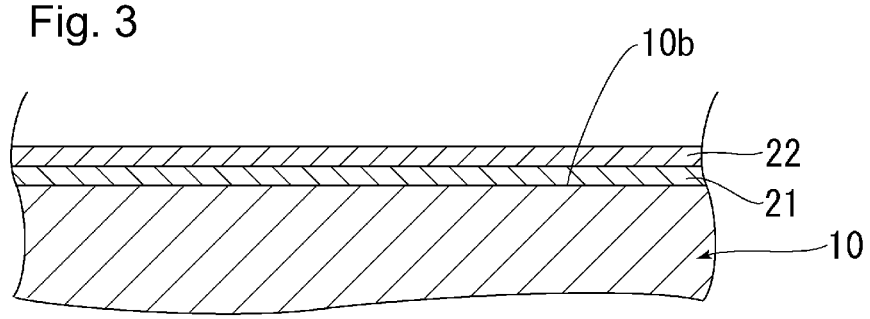
FIG. 3 is a schematic sectional view for explaining a process of manufacturing the solar cell in the embodiment.

First, semiconductor substrate 10 is prepared. Next, as illustrated in FIG. 3, i-type amorphous semiconductor film 21 and n-type amorphous semiconductor film 22 are formed on back surface 10b of semiconductor substrate 10. A method of forming each of i-type amorphous semiconductor film 21 and n-type amorphous semiconductor film 22 is not particularly limited. Each of i-type amorphous semiconductor film 21 and n-type amorphous semiconductor film 22 may be formed by a chemical vapor deposition (CVD) method such as a plasma CVD method, for example.

Figure 4:
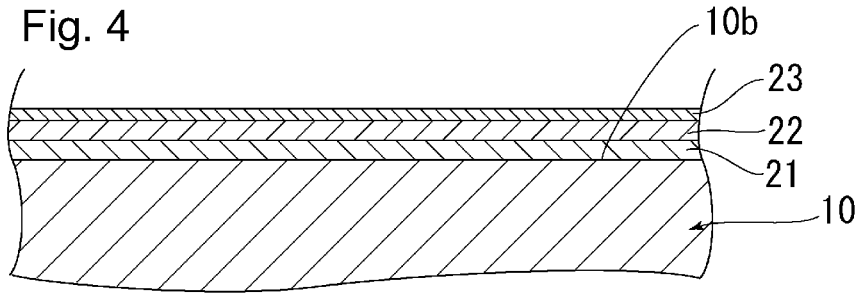
FIG. 4 is a schematic sectional view for explaining a process of manufacturing the solar cell in the embodiment.

Next, as illustrated in FIG. 4, anti-diffusion film 23 is formed on n-type amorphous semiconductor film 22. A method of forming anti-diffusion film 23 is not particularly limited. Anti-diffusion film 23 may be formed by a thin-film formation method such as a sputtering method or a CVD method, for example. When a Si-rich silicon nitride film is formed as anti-diffusion film 23, the film is formed under a film formation condition satisfying Si 80%: N 20%.

Figure 5:
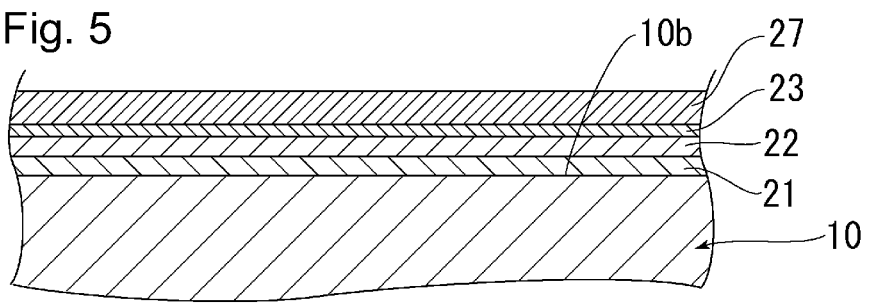
FIG. 5 is a schematic sectional view for explaining a process of manufacturing the solar cell in the embodiment.

Next, as illustrated in FIG. 5, insulating layer 27 is formed on anti-diffusion film 23. A method of forming insulating layer 27 is not particularly limited. Insulating layer 27 may be formed by a sputtering method or a CVD method, for example. When a silicon nitride film is formed as insulating layer 27, the film is formed under a film formation condition satisfying Si 55%: N 45%.

Figure 6:
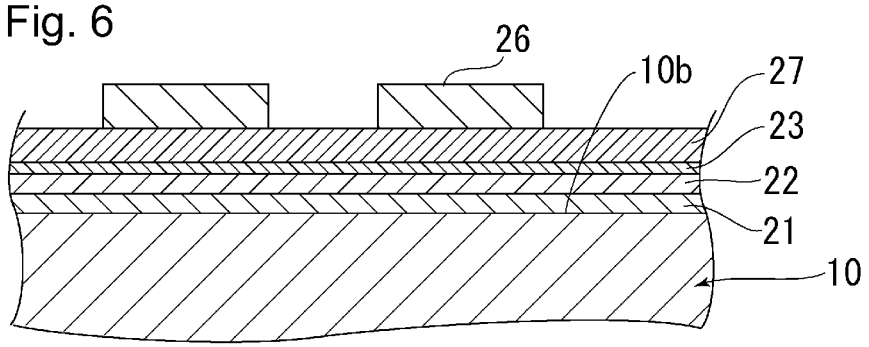
FIG. 6 is a schematic sectional view for explaining a process of manufacturing the solar cell in the embodiment.
Figure 7:
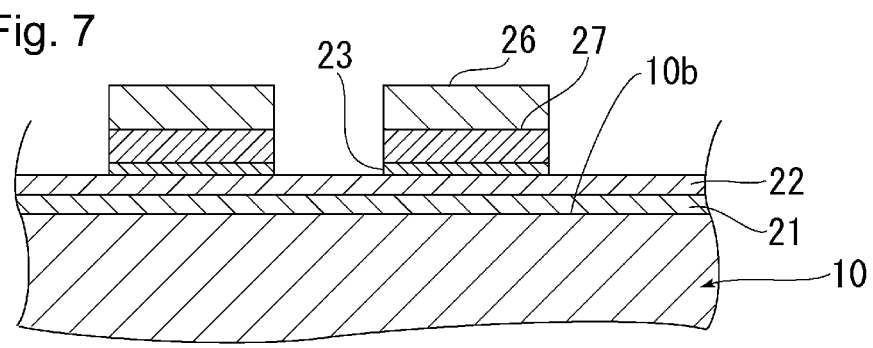
FIG. 7 is a schematic sectional view for explaining a process of manufacturing the solar cell in the embodiment.

Next, as illustrated in FIG. 6, resist pattern 26 is formed on insulating layer 27 by a photolithography method. Resist pattern 26 is formed in a region other than a region where a p-type semiconductor layer is joined to semiconductor substrate 10 in a later process.

Next, insulating layer 27 and anti-diffusion film 23 are etched with resist pattern 26 used as a mask. This process removes a part of insulating layer 27 and anti-diffusion film 23 other than a part thereof covered with resist pattern 26, and exposes n-type amorphous semiconductor film 22. When insulating layer 27 is formed of silicon nitride or silicon oxynitride and anti-diffusion film 23 is formed of a Si-rich silicon nitride film or silicon oxide, insulating layer 27 and anti-diffusion film 23 may be etched by using an acid etchant such as an HF aqueous solution.

Figure 8:
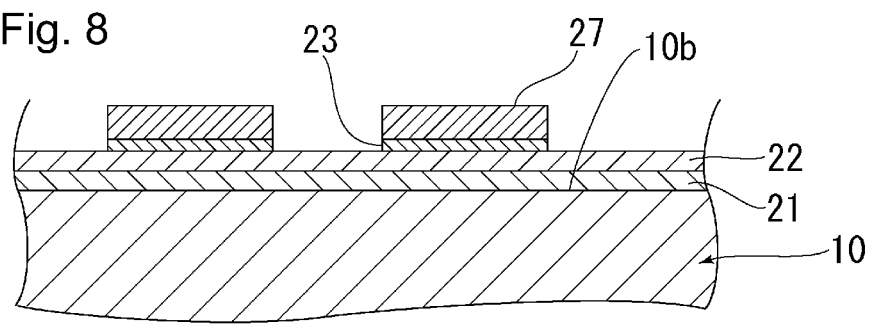
FIG. 8 is a schematic sectional view for explaining a process of manufacturing the solar cell in the embodiment.

Next, as illustrated in FIG. 8, resist pattern 26 is removed. Note that the resist pattern may be removed by using tetra-methyl ammonium hydroxide (TMAH), for example.

Figure 9:
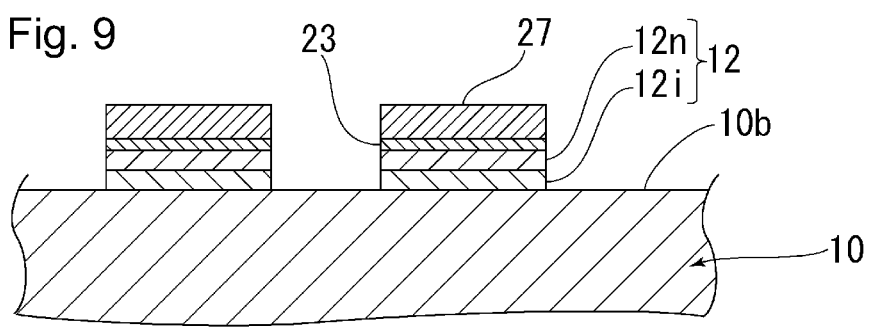
FIG. 9 is a schematic sectional view for explaining a process of manufacturing the solar cell in the embodiment.

Next, as illustrated in FIG. 9, i-type amorphous semiconductor film 21 and n-type amorphous semiconductor film 22 are etched by using an alkaline etchant with insulating layer 27 and anti-diffusion film 23 used as a mask. This process removes part of i-type amorphous semiconductor film 21 and n-type amorphous semiconductor film 22 not covered with insulating layer 27 and anti-diffusion film 23. Thereby, first semiconductor layer 12 including i-type amorphous semiconductor film 12i and n-type amorphous semiconductor film 12n is formed from i-type amorphous semiconductor film 21 and n-type amorphous semiconductor film 22.

Here, in this embodiment, as described above, insulating layer 27 is formed of silicon nitride or silicon oxynitride and anti-diffusion film 23 is formed of a Si-rich silicon nitride film or silicon oxide. Accordingly, the etching rate for insulating layer 27 and anti-diffusion film 23 to be etched using an acid etchant is high but the etching rate for insulating layer 27 to be etched using an alkaline etchant is low. Meanwhile, i-type amorphous semiconductor film 21 and n-type amorphous semiconductor film 22 are formed of amorphous silicon. Accordingly, the etching rate for i-type amorphous semiconductor film 21 and n-type amorphous semiconductor film 22 to be etched is low using an acid etchant and high using an alkaline etchant. For these reasons, in the process illustrated in FIG. 7, insulating layer 27 and anti-diffusion film 23 are etched but i-type amorphous semiconductor film 21 and n-type amorphous semiconductor film 22 are not substantially etched using the acid etchant. On the other hand, in the process illustrated in FIG. 9, i-type amorphous semiconductor film 21 and n-type amorphous semiconductor film 22 are etched but insulating layer 27 and anti-diffusion film 23 are not substantially etched using the alkaline etchant. Thereby, any of sets of insulating layer 27 and anti-diffusion film 23 and of i-type amorphous semiconductor film 21 and n-type amorphous semiconductor film 22 can be selectively etched in the processes illustrated in FIGS. 7 and 9.

Figure 10:
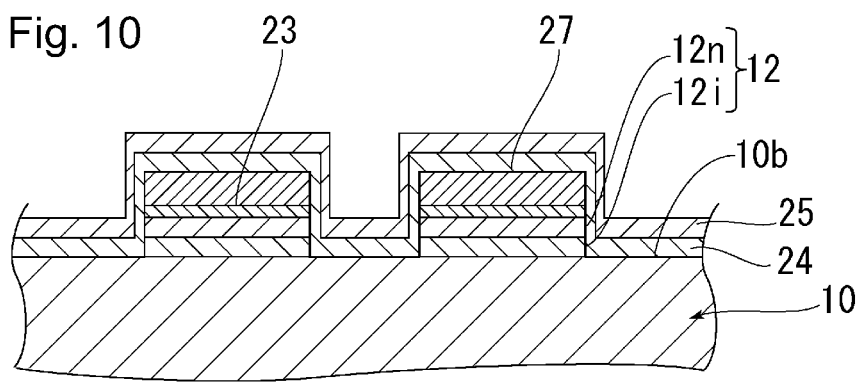
FIG. 10 is a schematic sectional view for explaining a process of manufacturing the solar cell in the embodiment.

Next, as illustrated in FIG. 10, i-type amorphous semiconductor film 24 and p-type amorphous semiconductor film 25 are sequentially formed in this order on insulating layer 27 and back surface 10b of semiconductor substrate 10. A method of forming i-type amorphous semiconductor film 24 and p-type amorphous semiconductor film 25 is not particularly limited. I-type amorphous semiconductor film 24 and p-type amorphous semiconductor film 25 may be formed by a CVD method, for example.

Figure 11:
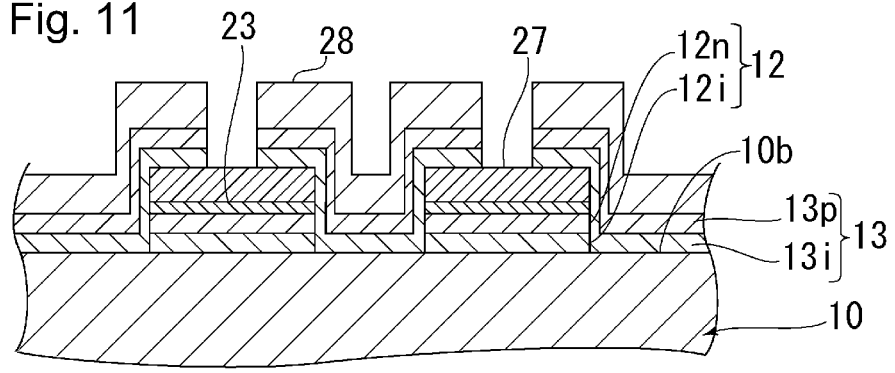
FIG. 11 is a schematic sectional view for explaining a process of manufacturing the solar cell in the embodiment.

Next, as illustrated in FIG. 11, resist pattern 28 is formed, and i-type amorphous semiconductor film 24 and p-type amorphous semiconductor film 25 illustrated in FIG. 10 are etched with resist pattern 28 used as a mask, by using the same alkaline etchant as one used in the process illustrated in FIG. 9. Thus, i-type amorphous semiconductor film 13i and p-type amorphous semiconductor film 13p are formed from i-type amorphous semiconductor film 24 and p-type amorphous semiconductor film 25, and thereby second semiconductor layer 13 is formed.

Figure 12:
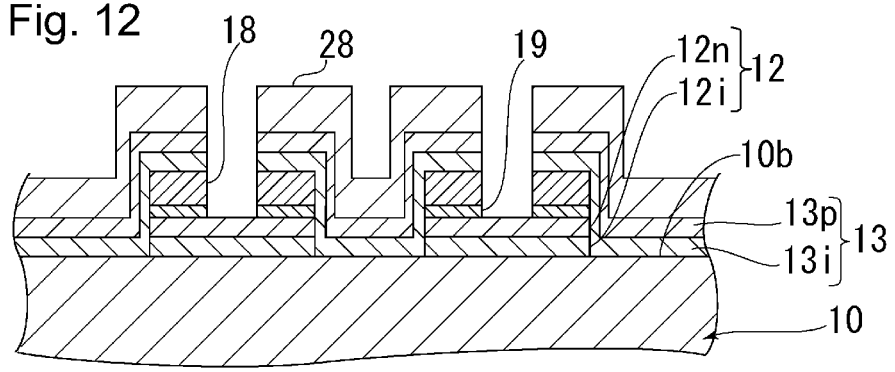
FIG. 12 is a schematic sectional view for explaining a process of manufacturing the solar cell in the embodiment.

Next, as illustrated in FIG. 12, insulating layer 27 and anti-diffusion film 23 are etched. Specifically, an exposed part of insulating layer 27 and anti-diffusion film 23 not covered with resist pattern 28 is etched and removed using the same acid etchant as one used in the process illustrated in FIG. 7. Thereby, n-type amorphous semiconductor film 12n is exposed, and insulating layer 18 is formed from insulating layer 27 illustrated in FIG. 11 and anti-diffusion film 19 is formed from anti-diffusion film 23 illustrated in FIG. 11.

Figure 13:
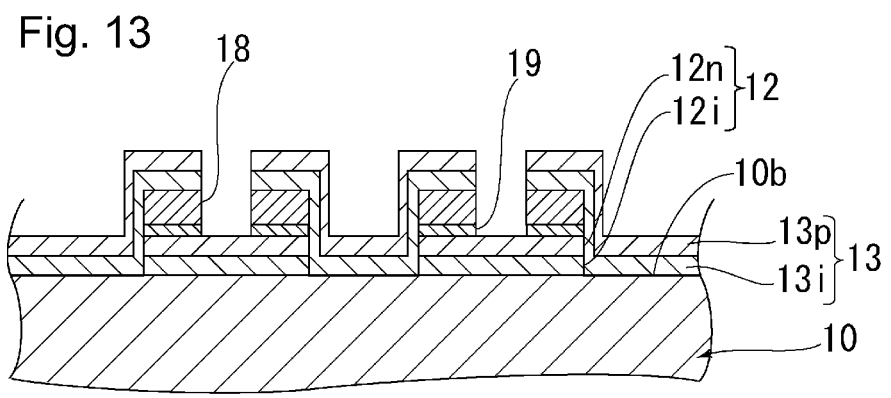
FIG. 13 is a schematic sectional view for explaining a process of manufacturing the solar cell in the embodiment.

Next, as illustrated in FIG. 13, resist pattern 28 illustrated in FIG. 12 is removed. Resist pattern 28 is removed by the same method as one in the process illustrated in FIG. 8.

With the above processes, n-type first semiconductor layer 12 including i-type amorphous semiconductor film 12i and n-type amorphous semiconductor film 12n and p-type second semiconductor layer 13 including i-type amorphous semiconductor film 13i and p-type amorphous semiconductor film 13p can be formed on first main surface 10b of semiconductor substrate 10.

Figure 14:
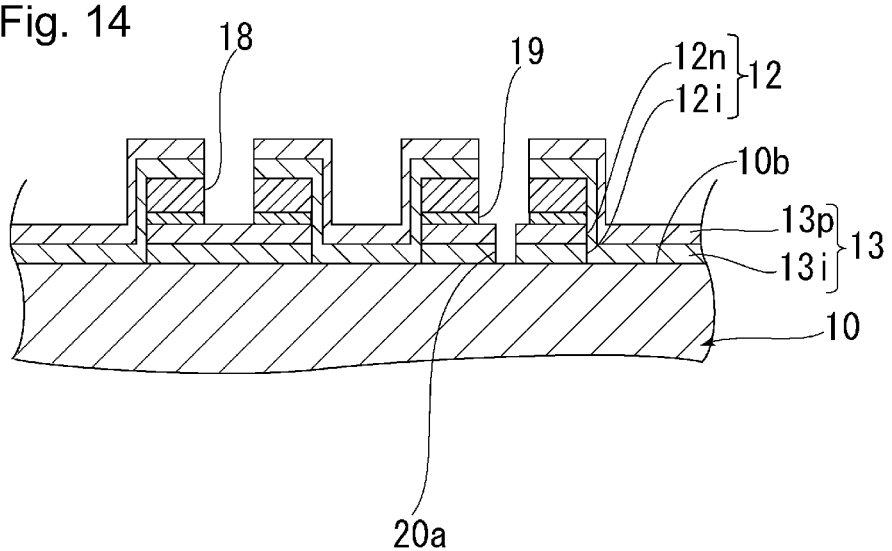
FIG. 14 is a schematic sectional view for explaining a process of manufacturing the solar cell in the embodiment.

Next, as illustrated in FIG. 14, through-hole 20a is formed in first semiconductor layer 12 at a position where leak path 20 in n-type region R1' illustrated in FIG. 2 is intended to be formed. Through-hole 20a may be formed by irradiation with laser light or a photolithography method, for example. The size of through-hole 20a is determined appropriately according to the sectional area (sectional areas in the x and y directions) of leak path 20 intended to be formed, for example.

Figure 15:
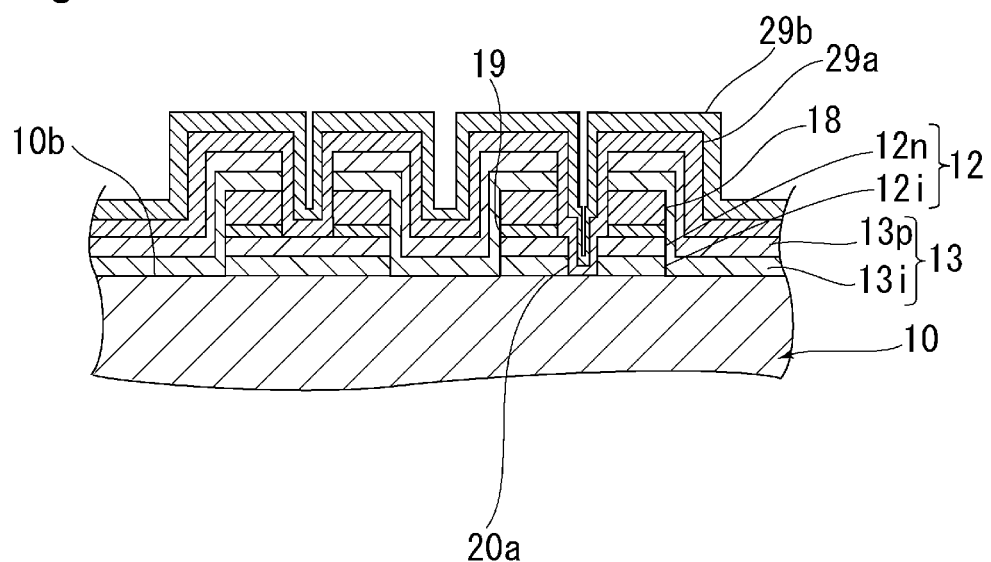
FIG. 15 is a schematic sectional view for explaining a process of manufacturing the solar cell in the embodiment.

Next, as illustrated in FIG. 15, first conductive layer 29a formed of TCO and second conductive layer 29b formed of metal such as Cu or an alloy thereof are formed over the entire surface. First conductive layer 29a and second conductive layer 29b are formed in this order by a thin-film formation method such as a CVD method (e.g., a plasma CVD method) or a sputtering method. First conductive layer 29a and second conductive layer 29b are provided in contact with back surface 10b of semiconductor substrate 10 at through-hole 20a.

Next, as illustrated in FIG. 16, parts of first conductive layer 29a and second conductive layer 29b corresponding to insulating region R3 are removed by etching or the like. This process divides first conductive layer 29a and second conductive layer 29b to form first conductive layer 30a and second conductive layer 30b. Next, third conductive layer 30c formed of Cu and fourth conductive layer 30d formed of Sn are sequentially formed by electrolytic plating on first conductive layer 30a and second conductive layer 30b. Thereby, n-side electrode 14 and p-side electrode 15 illustrated in FIG. 2 are completed.

In addition, n-side electrode 14 is provided in contact with back surface 10b of semiconductor substrate 10 at through-hole 20a, so that leak path 20 is formed.

With the above processes, solar cell 1 illustrated in FIG. 2 can be manufactured.

Although an n-type is taken as an example of a first conductivity type and a p-type is taken as an example of a second conductivity type, the invention is not limited thereto. Instead, a p-type may be set as a first conductivity type and an n-type may be set as a second conductivity type.

According to the embodiments above, it is possible to prevent nitrogen from diffusing from the insulating layer.

The invention includes other embodiments in addition to the above-described embodiments without departing from the spirit of the invention. The embodiments are to be considered in all respects as illustrative, and not restrictive. The scope of the invention is indicated by the appended claims rather than by the foregoing description. Hence, all configurations including the meaning and range within equivalent arrangements of the claims are intended to be embraced in the invention.

The invention claimed is:

1. A solar cell, comprising:
    a semiconductor substrate of any one of a first conductivity type and a second conductivity type including a first main surface and a second main surface;
    a first amorphous silicon layer of the first conductivity type provided on the first main surface;
    a second amorphous silicon layer of the second conductivity oxide type provided on the first main surface;
    a first electrode comprising a transparent conductive oxide layer and electrically connected to the first amorphous silicon layer;
    a second electrode electrically connected to the second amorphous silicon layer;
    an insulating layer comprising silicon nitride and arranged between the first amorphous silicon layer and the second amorphous silicon layer in an overlap region where the second amorphous silicon layer is provided above the first amorphous silicon layer in a first direction orthogonal to the first main surface; and
    an anti-diffusion film arranged between the insulating layer and the first amorphous silicon layer in the overlap region in the first direction and arranged between the second amorphous silicon layer and the transparent conductive oxide layer of the first electrode in a second direction parallel to the first main surface, the anti-diffusion film being configured to prevent nitrogen from diffusing from the insulating layer into the first amorphous silicon layer, a thickness of the anti-diffusion film being in a range of 1 nm to 5 nm.

2. The solar cell according to claim 1, wherein the anti-diffusion film is formed of a Si-rich silicon nitride film.

3. The solar cell according to claim 2, wherein a concentration of silicon atoms in the anti-diffusion film is higher than a concentration of silicon atoms in the insulating layer.

4. The solar cell according to claim 1, wherein the anti-diffusion film is formed of a silicon oxide film.

5. The solar cell according to claim 1, further comprising a through-hole formed in any one of the first amorphous silicon layer and the second amorphous silicon layer, wherein
    one of the first electrode and the second electrode extends in the through-hole and directly contacts the first main surface, thereby forming a leak path when a reversely-biased voltage is applied to the solar cell, the one of the first electrode and the second electrode being electrically connected to the one of the first amorphous silicon-layer and the second amorphous silicon layer in which the through-hole is formed.

6. The solar cell according to claim 1, wherein
    the first amorphous silicon layer has a layered structure including a first intrinsic semiconductor film formed on the first main surface and a first semiconductor film of the first conductivity type formed on the first intrinsic semiconductor film, and
    the second amorphous silicon layer has a layered structure including a second intrinsic semiconductor film formed on the first main surface and a second semiconductor film of the second conductivity type formed on the second intrinsic semiconductor film.

7. The solar cell according to claim 1, wherein the insulating layer is in direct contact with the second amorphous silicon layer of the second conductivity type.

8. The solar cell according to claim 1, wherein
    the insulating layer has an upper surface and a lower surface that are parallel to the first main surface of the semiconductor substrate,
    the lower surface of the insulating layer is in direct contact with the anti-diffusion film, and
    the upper surface of the insulating layer is entirely and directly covered with the second amorphous silicon layer of the second conductivity type.

9. A solar cell comprising:
    a semiconductor substrate of any one of a first conductivity type and a second conductivity type including a first main surface and a second main surface;
    a first semiconductor layer of the first conductivity type provided on the first main surface;
    a second semiconductor layer of the second conductivity type provided on the first main surface;
    a first electrode electrically connected to the first semiconductor layer;
    a second electrode electrically connected to the second semiconductor layer;

an insulating layer comprising silicon nitride and arranged between the first semiconductor layer and the second semiconductor layer in an overlap region where the second semiconductor layer is provided above the first semiconductor layer;

an anti-diffusion film arranged between the insulating layer and the first semiconductor layer in the overlap region, the anti-diffusion film being configured to prevent nitrogen from diffusing from the insulating layer into the first semiconductor layer; and a through-hole in any one of the first semiconductor layer and the second semiconductor layer, wherein one of the first electrode and the second electrode extends in the through-hole and directly contacts with the first main surface, the one of the first electrode and the second electrode being electrically connected to the one of the first semiconductor layer and the second semiconductor layer in which the through-hole is formed.

10. The solar cell according to claim 9, wherein the anti-diffusion film is formed of a Si-rich silicon nitride film.

11. The solar cell according to claim 10, wherein a concentration of silicon atoms in the anti-diffusion film is higher than a concentration of silicon atoms in the insulating layer.

12. The solar cell according to claim 9, wherein the anti-diffusion film is formed of a silicon oxide film.

13. The solar cell according to claim 9, wherein the first semiconductor layer and the second semiconductor layer are each formed of amorphous silicon.

14. The solar cell according to claim 9, wherein the first semiconductor layer comprises a layered structure including a first intrinsic semiconductor film formed on the first main surface and a first semiconductor film of the first conductivity type formed on the first intrinsic semiconductor film, and the second semiconductor layer comprises a layered structure including a second intrinsic semiconductor film formed on the first main surface and a second semiconductor film of the second conductivity type formed on the second intrinsic semiconductor film.

15. The solar cell according to claim 9, wherein the insulating layer is in direct contact with the second semiconductor layer of the second conductivity type.

16. The solar cell according to claim 9, wherein the insulating layer comprises an upper surface and a lower surface that are parallel to the first main surface of the semiconductor substrate, the lower surface of the insulating layer is in direct contact with the anti-diffusion film, and the upper surface of the insulating layer is entirely and directly covered with the second semiconductor layer of the second conductivity type.

17. The solar cell according to claim 1, wherein a thickness of the insulating layer comprising silicon nitride is in a range of 30 nm to 100 nm.

* * * * *